United States Patent
Huang et al.

(10) Patent No.: US 12,471,338 B2
(45) Date of Patent: Nov. 11, 2025

(54) TRENCH TYPE SILICON CARBIDE MOSFET STRUCTURE AND PREPARATION METHOD THEREOF

(71) Applicant: Guangzhou ANHI Semiconductor Co., Ltd., Guangzhou (CN)

(72) Inventors: Xin Huang, Guangzhou (CN); Hongbo Gao, Guangzhou (CN)

(73) Assignee: Guangzhou Anhi Semiconductor Co., Ltd., Guangzhou (CN)

( * ) Notice: Subject to any disclaimer, the term of this patent is extended or adjusted under 35 U.S.C. 154(b) by 489 days.

(21) Appl. No.: 18/299,372

(22) Filed: Apr. 12, 2023

(65) Prior Publication Data

US 2024/0145548 A1   May 2, 2024

(30) Foreign Application Priority Data

Oct. 31, 2022 (CN) .......................... 202211350363.9

(51) Int. Cl.
*H10D 62/832* (2025.01)
*H10D 12/01* (2025.01)
*H10D 30/01* (2025.01)
*H10D 30/66* (2025.01)

(52) U.S. Cl.
CPC ....... *H10D 62/8325* (2025.01); *H10D 12/031* (2025.01); *H10D 30/0297* (2025.01); *H10D 30/668* (2025.01)

(58) Field of Classification Search
CPC ............. H10D 62/8325; H10D 30/668; H10D 30/0297; H10D 12/031
USPC ........................................................... 257/77
See application file for complete search history.

(56) References Cited

FOREIGN PATENT DOCUMENTS

| CN | 115394835 A | * | 11/2022 | ............. H10D 30/60 |
| CN | 119855174 A | * | 4/2025 | |

OTHER PUBLICATIONS

CN-115394835-A With English translation (Year: 2022).*
CN-119855174-A With English translation (Year: 2025).*

* cited by examiner

*Primary Examiner* — Igwe U Anya
(74) *Attorney, Agent, or Firm* — Wang Law Firm, Inc.

(57) ABSTRACT

A trench type silicon carbide MOSFET structure and a preparation method thereof. The trench type silicon carbide MOSFET structure comprises a trench gate region. The trench gate region comprises at least one first PN junction formed by doping; and at least one second PN junction formed by doping, wherein the second PN junction is juxtaposed and oppositely disposed to the first PN junction. The trench type silicon carbide MOSFET structure of the present invention reduces the input capacitance and the output capacitance of the silicon carbide MOSFET structure by forming two PN junctions disposed oppositely.

10 Claims, 10 Drawing Sheets

TRENCH TYPE SILICON CARBIDE MOSFET STRUCTURE AND PREPARATION METHOD THEREOF

TECHNICAL FIELD

The present invention relates to the field of semiconductor device, and more particularly, to a trench type silicon carbide MOSFET structure and a preparation method thereof.

BACKGROUND ART

Silicon carbide MOSFET, as the third generation power device, has the advantages of fast switching speed, wide bandgap, low power consumption, small on-resistance, high operating frequency and high temperature resistance, and has become the ideal device for high temperature, high voltage, high frequency and other special occasions. Silicon carbide MOSFET is developed to convert conventional planar structures into trench structures to improve performance. Silicon carbide MSOFET can be used at higher frequencies than Si devices, which requires that the silicon carbide MOSFET has a lower input capacitance (Ciss), an output capacitance (Coss) and a miller capacitance (Crss) to ensure faster switching speeds.

At present, most manufacturers have no suitable method for reducing input capacitance for rated voltage and rated VTH devices, and can only accept the capacitance value brought by the manufacture platform.

The information disclosed in this background section is intended merely to enhance an understanding of the general background of the present invention and should not be construed as an admission or any form of suggestion that such information constitutes the prior art that is known to one of ordinary skilled in the art.

SUMMARY OF THE INVENTION

The object of the present invention is to provide a trench type silicon carbide MOSFET structure for reducing the input capacitance and the output capacitance of the silicon carbide MOSFET structure by forming two PN junctions disposed oppositely.

To achieve the above object, an embodiment of the present invention provides a trench type silicon carbide MOSFET structure comprising a trench gate region, wherein the trench gate region comprises: at least one first PN junction formed by doping; and at least one second PN junction formed by doping, wherein the second PN junction is juxtaposed and oppositely disposed to the first PN junction.

In one or more embodiments of the present invention, the trench gate region comprises a control gate region and a shield gate region which are isolatedly disposed, wherein the first PN junction and the second PN junction are both formed within the control gate region.

In one or more embodiments of the present invention, the trench type silicon carbide MOSFET structure further comprises: a first conductivity type substrate; a first conductivity type semiconductor drift region formed above the first conductivity type substrate; a second conductivity type semiconductor base region formed above the first conductivity type semiconductor drift region; and a first conductivity type semiconductor source region formed above the second conductivity type semiconductor base region. The trench gate region is formed within the first conductivity type semiconductor drift region, the second conductivity type semiconductor base region and the first conductivity type semiconductor source region.

In one or more embodiments of the present invention, the trench gate region further comprises a trench extending into the first conductivity type semiconductor drift region sequentially through the first conductivity type semiconductor source region and the second conductivity type semiconductor base region from top to bottom, wherein the control gate region and the shield gate region are both located within the trench and the control gate region is located above the shield gate region.

In one or more embodiments of the present invention, the trench is filled with a first isolation dielectric, wherein the control gate region and the shield gate region are isolated from the first conductivity type semiconductor source region, the second conductivity type semiconductor base region and the first conductivity type semiconductor drift region by the first isolation dielectric.

In one or more embodiments of the present invention, a control gate structure is formed in the control gate region, and the control gate structure comprises a first conductivity type doped region and a second conductivity type doped region which are arranged laterally. A third conductivity type doped region is formed above the first conductivity type doped region by doping, and the first conductivity type doped region and the third conductivity type doped region form the first PN junction. A fourth conductivity type doped region is formed above the second conductivity type doped region by doping, and the second conductivity type doped region forms the second PN junction with the fourth conductivity type doped region located above the second conductivity type doped region.

In one or more embodiments of the present invention, the first conductivity type is N-type; the second conductivity type is P-type; the third conductivity type is P-type; and the fourth conductivity type is N-type.

In one or more embodiments of the present invention, the trench type silicon carbide MOSFET structure further comprises: a source electrode formed on the first conductivity type semiconductor source region and contacted therewith; a gate electrode in contact with the control gate structure; and a drain electrode formed below and in contact with the first conductivity type substrate.

In one or more embodiments of the present invention, the control gate structure is separated from the source electrode by a second isolation dielectric.

The present invention also provides a method for preparing a trench type silicon carbide MOSFET structure, comprising: forming a first PN junction by doping the control gate structure; and forming a second PN junction by doping the control gate structure, wherein the second PN junction is juxtaposed and oppositely disposed to the first PN junction.

Compared with the prior art, the trench type silicon carbide MOSFET structure of the embodiment of the present invention achieves the purpose of reducing the input capacitance and the output capacitance by forming two PN junction parasitic capacitances disposed oppositely by doping in the trench gate region, and the size of the parasitic capacitance can be adjusted by doping concentration.

The trench type silicon carbide MOSFET structure of embodiments of the present invention forms a pair of opposing PN junctions in the trench gate region, so that the trench type silicon carbide MOSFET structure can have bi-directional conduction, further reducing the Cgd and Cgs capacitances.

DETAILED DESCRIPTION OF THE INVENTION

The specific embodiments of the invention are described in detail in combination with the attached drawings below, but it should be understood that the scope of protection of the invention is not limited by the specific embodiments.

Throughout this description and the claims, unless expressly stated otherwise, the term "comprise", or variations such as "comprises" or "comprising", will be understood to imply the inclusion of a stated element or group of elements but not the exclusion of any other element or group of elements.

As noted in the background, it is desirable to have a silicon carbide MOSFET with lower input, output and miller capacitances in order to have faster switching speeds. However, the existing silicon carbide MOSFET structures cannot achieve smaller input, output and miller capacitances.

In order to solve the above technical problem, an embodiment of the present invention provides a trench type silicon carbide MOSFET structure for reducing an input capacitance and an output capacitance of the silicon carbide MOSFET structure by forming two PN junctions disposed oppositely.

Figure 1:
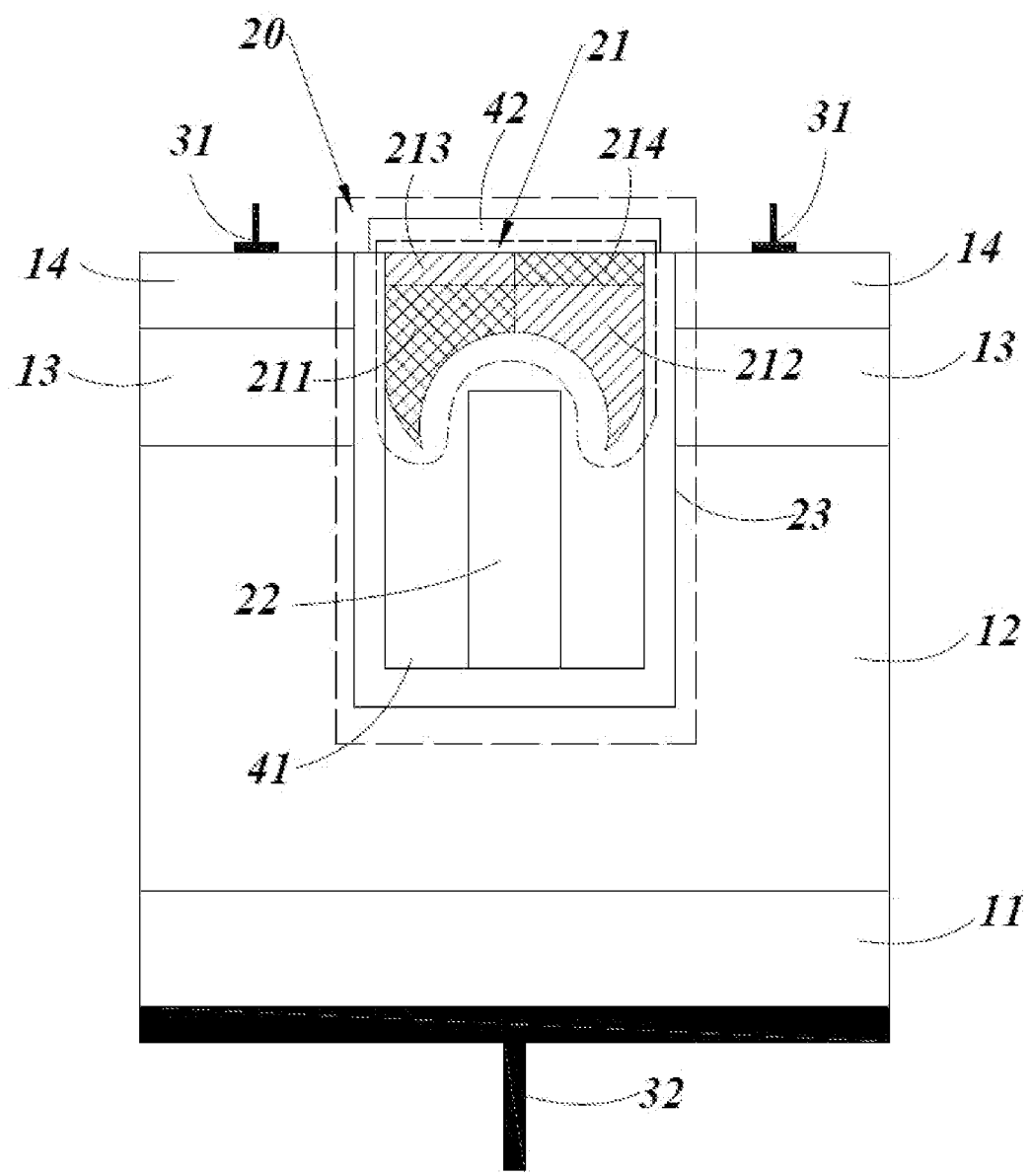
FIG. 1 shows a trench type silicon carbide MOSFET structure according to an embodiment of the present invention.

As shown in FIG. 1, a trench type silicon carbide MOSFET structure includes a first conductivity type substrate 11, a first conductivity type semiconductor drift region 12, a second conductivity type semiconductor base region 13, a first conductivity type semiconductor source region 14, a trench gate region 20, a source electrode 31, a gate electrode and a drain electrode 32.

The first conductivity type semiconductor drift region 12 is formed above the first conductivity type substrate 11. The second conductivity type semiconductor base region 13 is formed above the first conductivity type semiconductor drift region 12. The first conductivity type semiconductor source region 14 is formed above the second conductivity type semiconductor base region 13. The trench gate region 20 is formed within the first conductivity type semiconductor drift region 12, the second conductivity type semiconductor base region 13 and the first conductivity type semiconductor source region 14. The trench gate region 20 includes at least one first PN junction formed by doping and at least one second PN junction formed by doping, the second PN junction being juxtaposed and oppositely disposed to the first PN junction. That is to say, these two PN junctions are arranged in the sequence of P-N-P-N. The source electrode 31 is in contact with the first conductivity type semiconductor source region 14. The gate electrode is in contact with the first PN junction and the second PN junction trench gate region 20. The drain electrode 32 is in contact with the first conductivity type substrate 11.

The trench gate region 20 includes a trench 23, a control gate region 21 and a shield gate region 22. Both the first PN junction and the second PN junction are formed within the control gate region 21.

The trench 23 extends successively through the first conductivity type semiconductor source region 14 and the second conductivity type semiconductor base region 13 from top to bottom, and extends into the first conductivity type semiconductor drift region 12. Both the control gate region 21 and the shield gate region 22 are located within the trench 23, and the control gate region 21 is located above the shield gate region 22. The trench 23 is filled with a first isolation dielectrics 41. The control gate region 21 and the shield gate region 22 are isolated from the first conductivity type semiconductor source region 14, the second conductivity type semiconductor base region 13 and the first conductivity type semiconductor drift region 12 by the first isolation dielectrics 41. The control gate region 21 and the shield gate region 22 are also isolated from each other by the first isolation dielectrics 41. The first isolation dielectric 41 includes silicon oxide.

A control gate structure is formed in the control gate region 21, and the control gate structure includes a first conductivity type doped region 211 and a second conductivity type doped region 212 which are arranged laterally. A third conductivity type doped region 213 is formed above the first conductivity type doped region 211 by doping, and the first conductivity type doped region 211 and the third conductivity type doped region 213 form a first PN junction which is a forward PN junction. A fourth conductivity type doped region 214 is formed above the second conductivity type doped region 212 by doping, and the second conductivity type doped region 212 and the fourth conductivity type doped region 214 located above form a second PN junction which is an opposing PN junction.

In a specific embodiment, the conductive material in the first conductivity type doped region 211 includes polysilicon, and the doping concentration range of the first conductivity type doped region 211 is 1E15-5E15. The conductive material in the second conductivity type doped region 212 includes polysilicon, and the doping concentration range of the second conductivity type doped region 212 is 5E16-8E16. The conductive material in the third conductivity type doped region 213 includes polysilicon, and the doping concentration range of the third conductivity type doped region 213 is 5E16-8E16. The conductive material in the fourth conductivity type doped region 214 includes polysilicon, and the doping concentration of the fourth conductivity type doped region 214 ranges from 1E15 to 5E15.

The shield gate region 22 is filled with a shield gate conductive material including doped polysilicon.

In an embodiment, the first conductivity type is N-type. The second conductivity type is P-type. The third conductivity type is P-type. The fourth conductivity type is N-type. In other embodiments, the first conductivity type is P-type. The second conductivity type is N-type. The third conductivity type is N-type. The fourth conductivity type is P-type.

A source electrode 31 is formed on and in contact with the first conductivity type semiconductor source region 14. The control gate structure is isolated from the source electrode 31 by a second isolation dielectric 42. The second isolation dielectric 42 includes BPSG or TEOS. A gate electrode and the control gate structure are in contact. A drain electrode 32 is formed below and in contact with the first conductivity type substrate 11. The material of the source electrode 31 is aluminum. The material of the gate electrode is aluminum. The material of the drain electrode 32 is silver.

The working principle of the trench type silicon carbide MOSFET structure of the present invention is described below by taking the first conductivity type as N-type, the second conductivity type as P-type, the third conductivity type as P-type and the fourth conductivity type as N-type as an example.

First, the input capacitance Ciss refers to a capacitance between GS (a gate and a source), which is short-circuited by DS (a source and a drain) and measured by an alternating current signal. Ciss is composed of GS (a gate and a source) capacitance and GD (a gate and a drain) capacitance in parallel, i.e., Ciss=Cgs+Cgd. The output capacitance Coss refers to a capacitance between DS (a source and a drain), which is short-circuited by GS (a gate and a source) and measured by an alternating current signal. Coss is formed by connecting the GD (a gate and a drain) capacitance and the DS (a source and a drain) capacitance in parallel, namely Coss=Cgd+Cds. The reverse transfer capacitance Crss refers to a capacitance between GD (a gate and a drain) with S (a source) grounded, i.e., Crss=Cgd.

The trench type silicon carbide MOSFET structures of the present invention achieve the goal of reducing Ciss, Coss, and Crss by further reducing the Cgs and Cgd described above by adding a pair of opposing PN junctions.

Referring to FIG. 1, the trench type silicon carbide MOSFET structure of FIG. 1 defines a first PN junction formed by a first conductivity type doped region 211 and a third conductivity type doped region 213 as an A junction and a second PN junction formed by a second conductivity type doped region 212 and a fourth conductivity type doped region 214 as a B junction. The Cgs after increasing the A junction capacitance is denoted by Cgs*, and the Cgd after increasing the B junction capacitance is denoted by Cgd*. The new Cgs* is a series connection of the A junction capacitance and the original Cgs. According to the series capacitance formula 1/Cgs*=1/CpnA+1/Cgs, the Cgs* decreases. In this state, the B junction is in a conducting state here and does not participate in the capacitance. The new Cgd* is a series connection of the B junction capacitance and the original Cgd. According to the series capacitance formula: 1/Cgd*=1/CpnB+1/Cgd, Cgd is reduced. In this state, the A junction is in the conducting state and does not participate in the capacitance. Among them, Cgs is an original Cgs without adding a PN junction. Cgd is an original Cgd without adding a PN junction. CpnA is an A junction capacitance, and CpnB is a B junction capacitance. This has the effect of reducing the overall Ciss of the trench type silicon carbide MOSFET structure. CpnA and CpnB are determined by the doping concentration of N-type and P-type, and can be adjusted according to the process to achieve the desired values.

It also provides a method for preparing a trench type silicon carbide MOSFET structure in an embodiment of the present invention, including: forming a first PN junction by doping the control gate structure; forming a second PN junction by doping the control gate structure, wherein the second PN junction is juxtaposed and oppositely disposed to the first PN junction.

FIGS. 2-10 provide structural schematic diagrams of a process for preparing a trench type silicon carbide MOSFET structure according to an embodiment of the present invention. The process for preparing a trench type silicon carbide MOSFET structure in accordance with the present invention will now be described in detail with reference to a specific embodiment.

Figure 2:
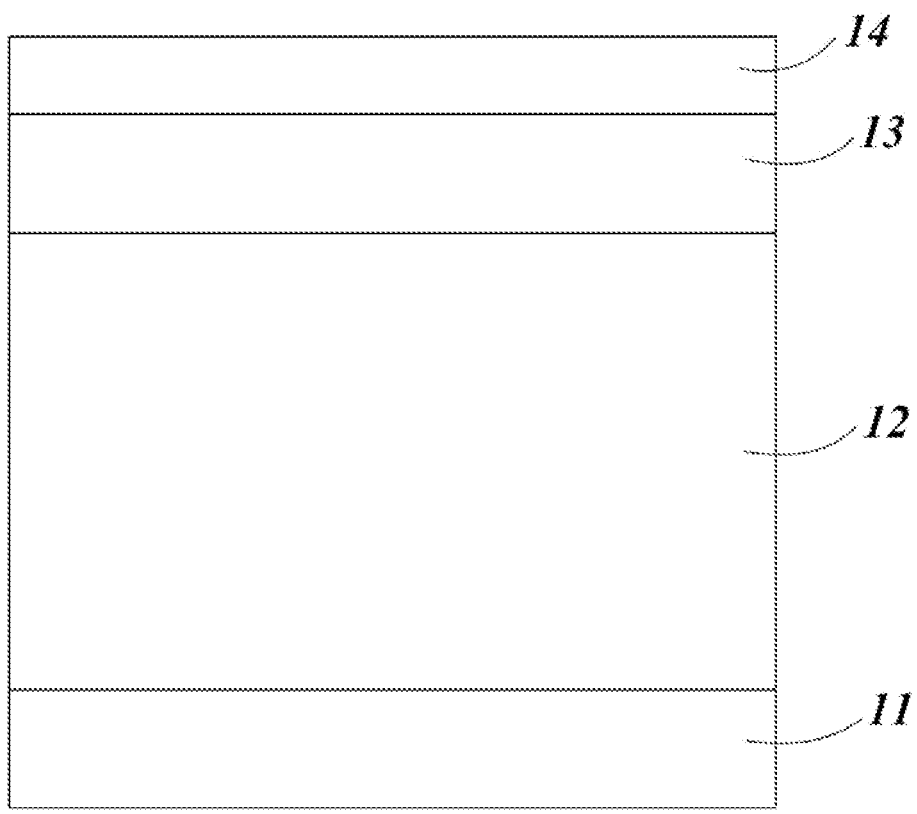
FIGS. 2-10 are structural schematic diagrams of a process for preparing a trench type silicon carbide MOSFET structure according to an embodiment of the present invention.

Referring to FIG. 2, an N-type semiconductor drift region 12 is formed on a semiconductor substrate 11. A P-type semiconductor base region 13 is formed on the N-type semiconductor drift region 12. An N-type semiconductor source region 14 is formed on the P-type semiconductor base region 13, and the doping concentration of the N-type semiconductor source region 14 is 1E16.

Figure 3:
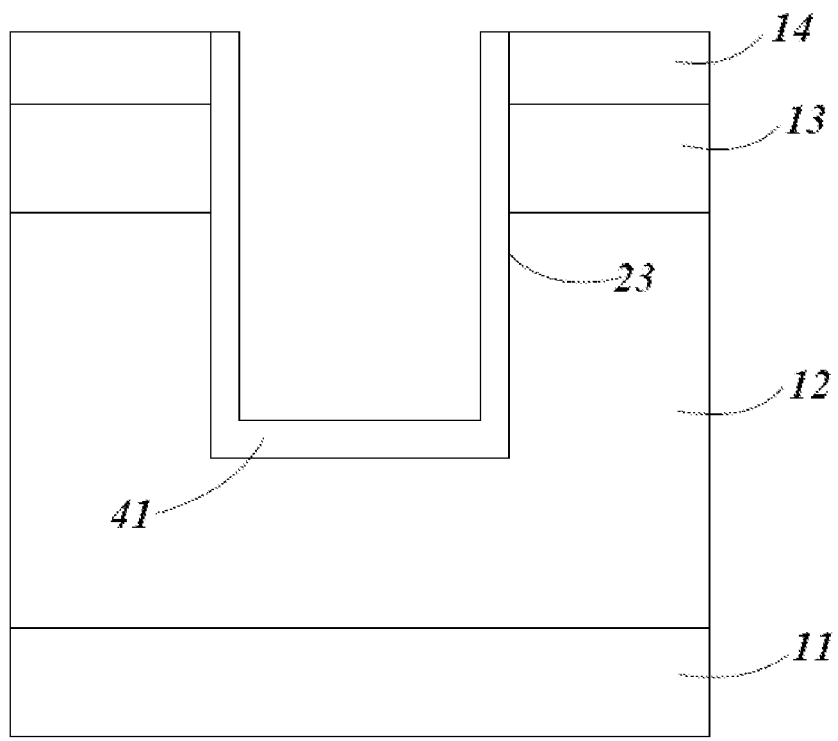

Referring to FIG. 3, a trench 23 of a desired depth is formed on the N-type semiconductor source region 14, the P-type semiconductor base region 13, and the N-type semiconductor drift region 12 by dielectric deposition, photolithography, and etching. A first isolation dielectric 41 is formed on the inner sidewalls and bottom wall of the trench 23.

Figure 4:
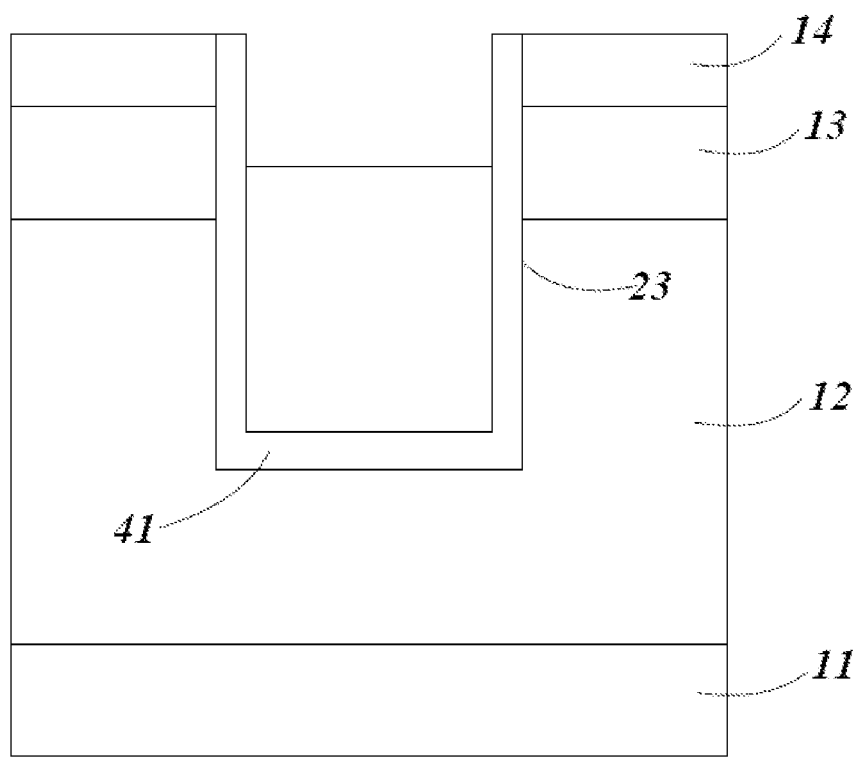
Figure 5:
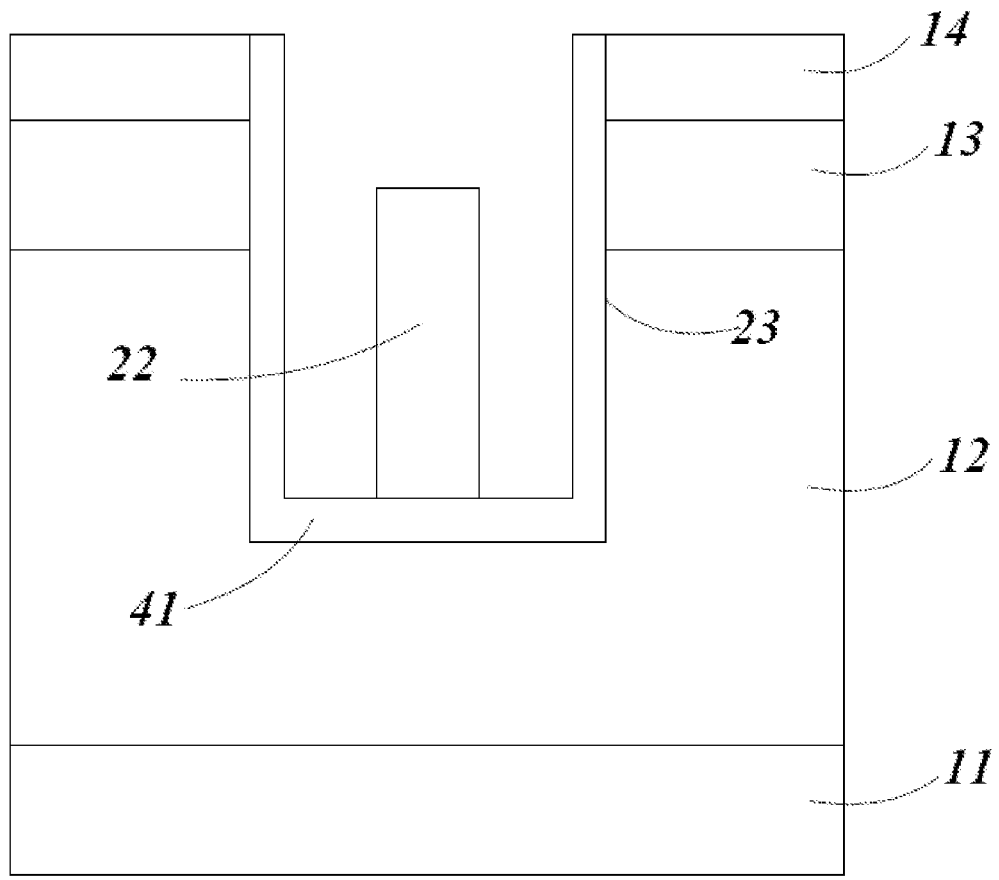
Figure 6:
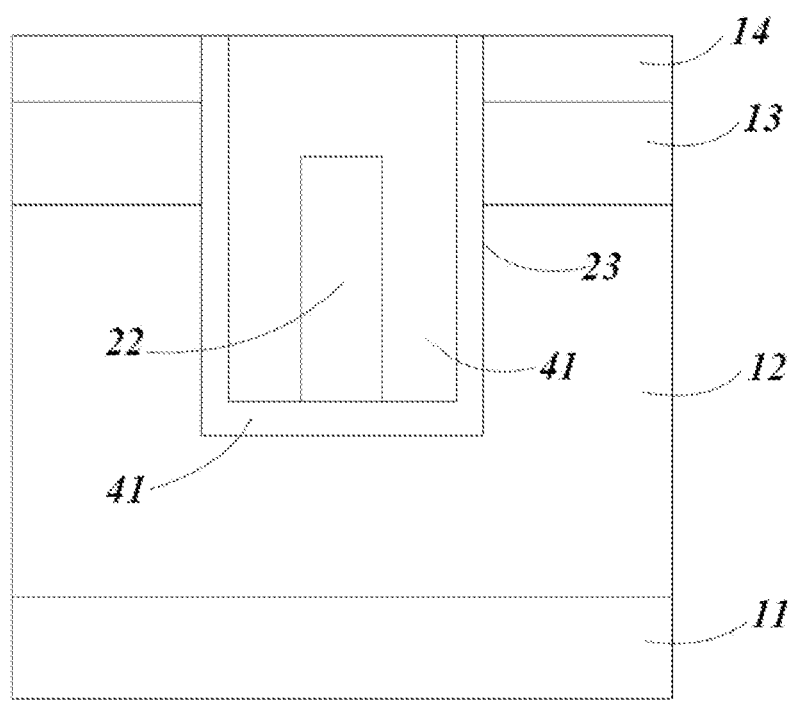

Referring to FIGS. 4 and 5, doped polysilicon is deposited in the trench 23 and etched to form a shield gate structure 22.

Referring to FIG. 6, the trench 23 is again filled with a first isolation dielectric material to form a first isolation dielectric 41 that completely fills the trench 23 to cover the shield gate structure 22.

Figure 7:
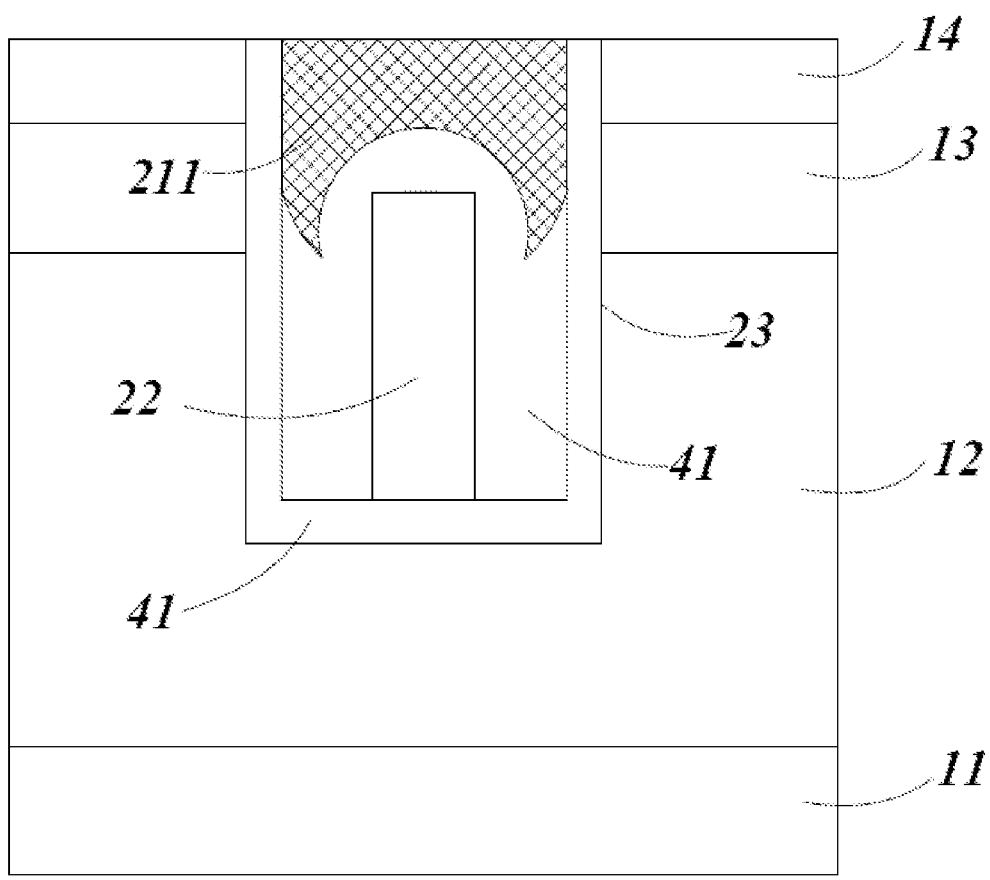

Referring to FIG. 7, the first isolation dielectric 41 is etched to form a cavity as shown, and doped polysilicon is deposited in the cavity to form a first conductivity type doped region 211, the upper surface of the first conductivity type doped region 211 being not higher than the upper surface of the first isolation dielectric 41 located on the inner sidewall of the trench 23.

Figure 8:
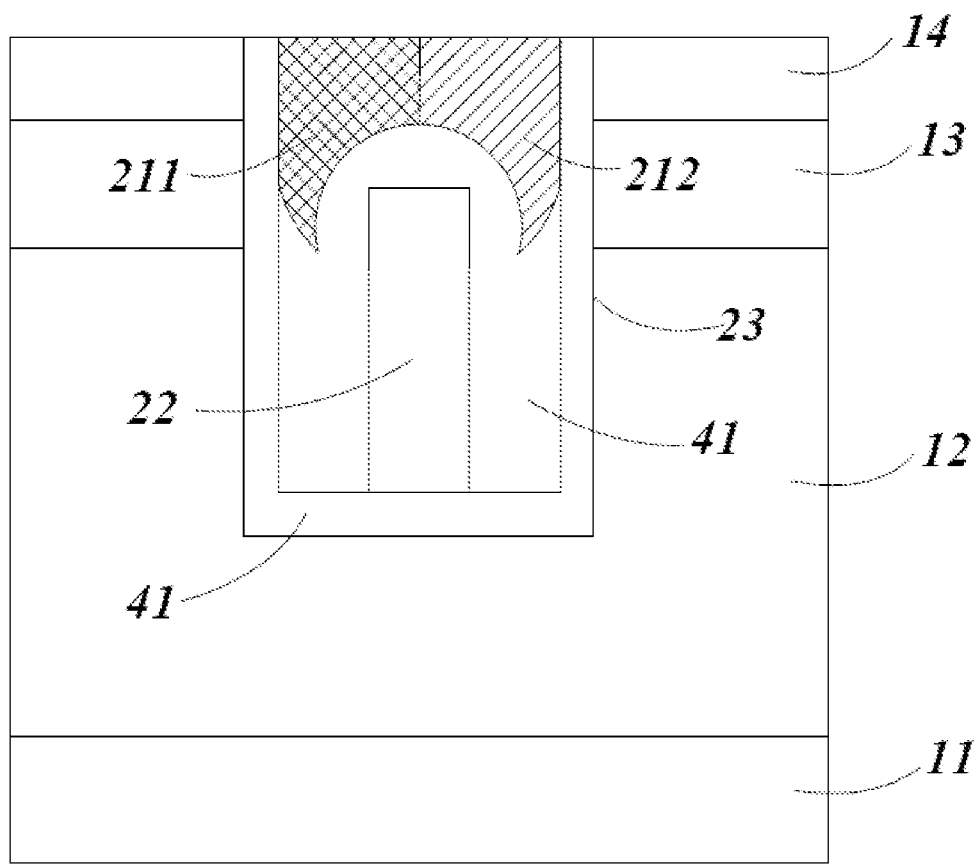

With reference to FIG. 8, second conductivity type doping is performed on the first conductivity type doped region 211 in the lateral direction thereof to form a second conductivity type doped region 212.

Figure 9:
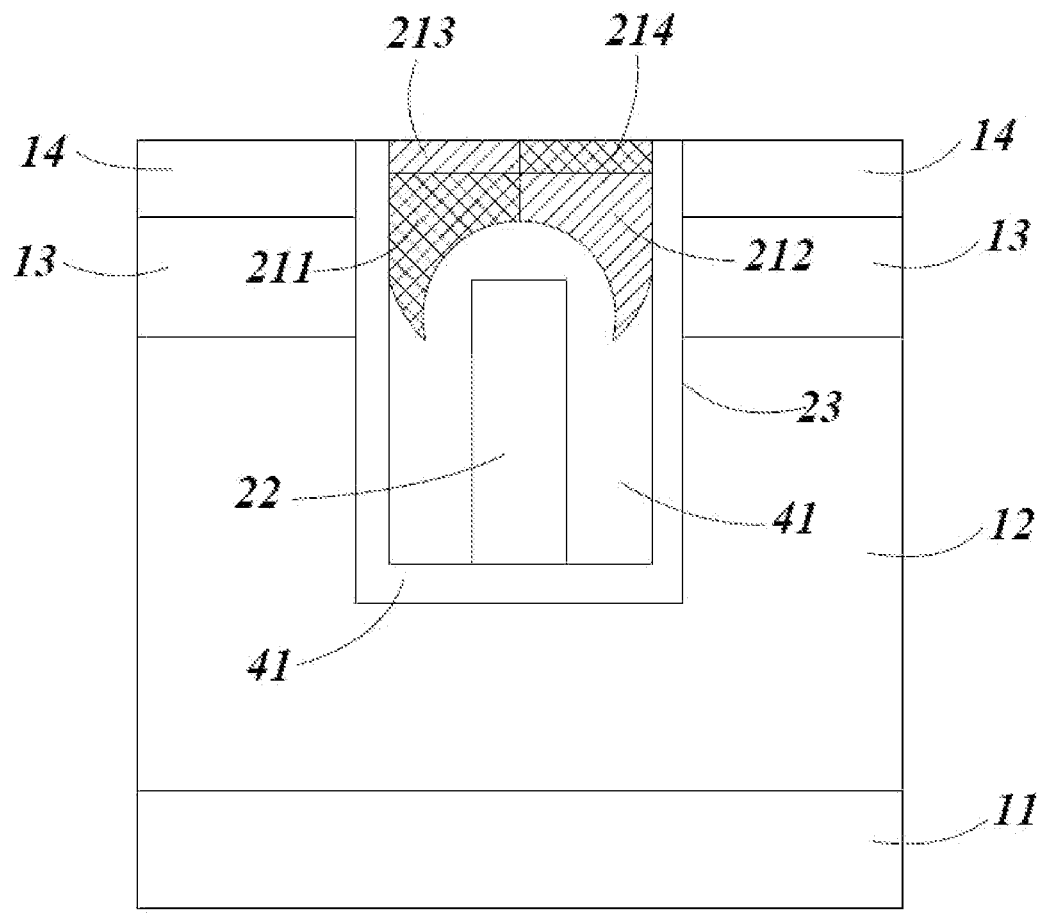

As shown with reference to FIG. 9, the first conductivity type doped region 211 is doped with a third conductivity type in the longitudinal direction thereof to form a third conductivity type doped region 213. Among them, the first conductivity type doped region 211 and the third conductivity type doped region 213 form a first PN junction. The second conductivity type doped region 212 is doped with a fourth conductivity type in the longitudinal direction thereof to form a fourth conductivity type doped region 214. Among them, the second conductivity type doped region 212 forms a second PN junction with the fourth conductivity type doped region 214 located thereabove. In this embodiment, the first conductivity type is N-type. The second conductivity type is P-type. The third conductivity type is P-type. The fourth conductivity type is N-type.

Figure 10:
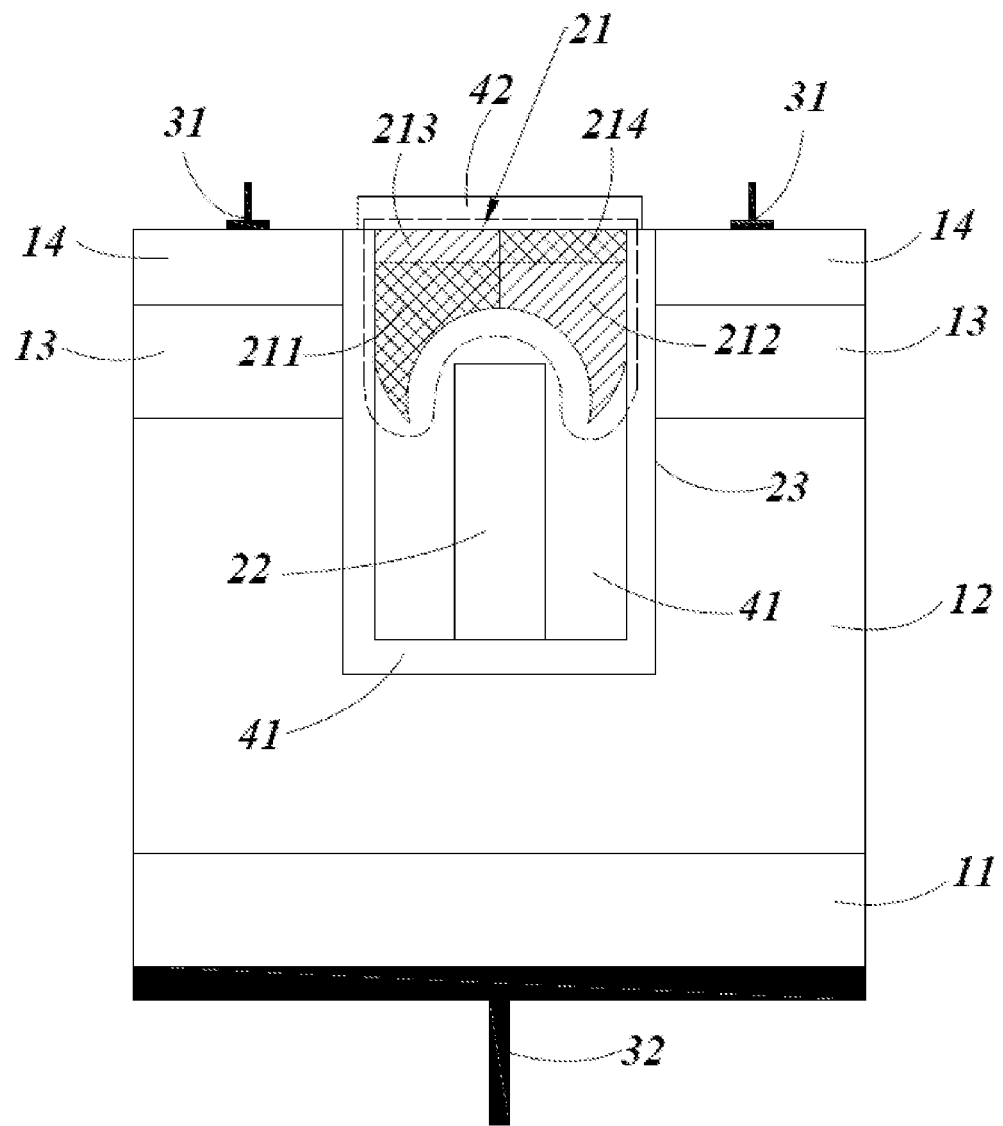

Referring to FIG. 10, a second isolation dielectric 42 is formed over the third conductivity type doped region 213 and the fourth conductivity type doped region 214. A drain electrode 32 is formed below the semiconductor substrate 11. A source electrode 31 is formed above the N-type semiconductor source region 14, the source electrode 31 being isolated from the control gate region 21 by a second isolation dielectric 42. A gate electrode is formed in communication with the trench gate region 20.

Compared with the prior art, the trench type silicon carbide MOSFET structure of the embodiment of the present invention achieves the purpose of reducing the input capacitance and the output capacitance by forming two PN junction parasitic capacitances disposed oppositely by doping in the trench gate region, and the size of the parasitic capacitance can be adjusted by doping concentration.

The trench type silicon carbide MOSFET structure of embodiments of the present invention forms a pair of opposing PN junctions in the trench gate region, so that the trench type silicon carbide MOSFET structure can have bi-directional conduction, further reducing the Cgd and Cgs capacitances.

The aspects, embodiments, features and examples of the invention should be considered in all respects as illustrative and not restrictive, the scope of the invention being defined only by the claims. Other embodiments, modifications, and uses will be apparent to those skilled in the art without departing from the spirit and scope of the invention as claimed.

Throughout this specification, where compositions are described as having, comprising, or including specific components, or where processes are described as having, including, or comprising specific process steps, it is contemplated that the compositions taught by the present invention also consist essentially of, or consist of, the recited components, and that the processes taught by the present invention also consist essentially of, or consist of, the recited process steps.

In this specification, where an element or component is referred to as being included in and/or selected from a list of recited elements or components, it should be understood that the element or component can be any one of the recited elements or components and can be selected from the group consisting of two or more of the recited elements or components. In addition, it should be understood that elements and/or features of a composition, an apparatus, or a method described herein may be combined in various ways, whether explicitly or implicitly, without departing from the spirit and scope of the present teachings.

The use of the terms "comprising" or "having" is generally construed as open-ended and non-limiting unless specifically stated otherwise.

The use of the singular herein includes the plural (and vice versa) unless specifically stated otherwise. Furthermore, the singular forms "a", "an", and "the" include plural forms unless the context clearly dictates otherwise. Further, where the term "about" is used before a quantity, the present teachings also include the specific quantity itself, unless specifically stated otherwise.

It should be understood that the order of steps or order for performing specific actions is not critical so long as the present teachings remain operable. Furthermore, two or more steps or actions may be performed simultaneously.

It should be understood that the figures and descriptions of the present invention have been simplified to illustrate elements that are relevant for a clear understanding of the present invention, while eliminating other elements for purposes of clarity. However, those skilled in the art will recognize that these and other elements may be desirable. However, since such elements are well known in the art, and they do not facilitate a better understanding of the present invention, a discussion of such elements is not provided herein. It should be understood that the figures are presented for purposes of illustration and not as structural drawings. Omitted details and modifications or alternative embodiments are within the understanding scope of those skilled in the art.

It will be appreciated that in certain aspects of the invention, a single component may be replaced by multiple components and that multiple components may be replaced by a single component to provide an element or structure or to perform a given function or functions. Such substitutions are considered to be within the scope of the invention, except where such substitutions are not intended to operate to practice particular embodiments of the invention.

While the invention has been described with reference to illustrative embodiments, it will be understood by those skilled in the art that various other changes, omissions and/or additions may be made and substantial equivalents may be substituted for elements of the embodiments without departing from the spirit and scope of the invention. In addition, many modifications may be made to adapt a particular situation or material to the teachings of the invention without departing from the scope thereof. Therefore, it is intended that the invention not be limited to the particular embodiments disclosed for carrying out this invention, but that the invention will include all embodiments falling within the scope of the appended claims. Furthermore, unless specifically stated otherwise, any use of the terms first, second, etc. do not denote any order or importance, but rather the terms first, second, etc. are used to distinguish one element from another.

What is claimed is:

1. A trench type silicon carbide MOSFET structure, comprising a trench gate region, wherein the trench gate region comprises:
   at least one first PN junction formed by doping; and
   at least one second PN junction formed by doping, wherein the second PN junction is juxtaposed and oppositely disposed with respect to the first PN junction.

2. The trench type silicon carbide MOSFET structure according to claim 1, wherein the trench gate region comprises a control gate region and a shield gate region which are isolated with each other, wherein the first PN junction and the second PN junction are both formed within the control gate region.

3. The trench type silicon carbide MOSFET structure according to claim 2, further comprising:
   a first conductivity type substrate;
   a first conductivity type semiconductor drift region formed above the first conductivity type substrate;
   a second conductivity type semiconductor base region formed above the first conductivity type semiconductor drift region; and
   a first conductivity type semiconductor source region formed above the second conductivity type semiconductor base region;
   wherein the trench gate region is formed within the first conductivity type semiconductor drift region, the second conductivity type semiconductor base region and the first conductivity type semiconductor source region.

4. The trench type silicon carbide MOSFET structure according to claim 3, wherein the trench gate region further comprises a trench extending through the first conductivity type semiconductor source region and the second conductivity type semiconductor base region sequentially, and extending into the first conductivity type semiconductor drift region, wherein the control gate region and the shield gate region are both located within the trench and the control gate region is located above the shield gate region.

5. The trench type silicon carbide MOSFET structure according to claim 4, wherein the trench is filled with a first isolation dielectrics, the control gate region and the shield gate region are isolated from the first conductivity type semiconductor source region, the second conductivity type semiconductor base region and the first conductivity type semiconductor drift region by the first isolation dielectrics.

6. The trench type silicon carbide MOSFET structure according to claim 3, wherein a control gate structure is formed in the control gate region, and the control gate structure comprises a first conductivity type doped region and a second conductivity type doped region which are arranged laterally;
   wherein a third conductivity type doped region is formed above the first conductivity type doped region by doping, and the first conductivity type doped region and the third conductivity type doped region together form the first PN junction; and
   a fourth conductivity type doped region is formed above the second conductivity type doped region by doping, and the second conductivity type doped region forms the second PN junction together with the fourth conductivity type doped region located above the second conductivity type doped region.

7. The trench type silicon carbide MOSFET structure according to claim 6, wherein the first conductivity type is N-type; the second conductivity type is P-type; the third conductivity type is P-type; and the fourth conductivity type is N-type.

8. The trench type silicon carbide MOSFET structure according to claim 6, further comprising:
   a source electrode formed on the first conductivity type semiconductor source region and contacting therewith;
   a gate electrode in contact with the control gate structure; and
   a drain electrode formed below the first conductivity type substrate and contacting therewith.

9. The trench type silicon carbide MOSFET structure according to claim 8, wherein the control gate structure is isolated from the source electrode by a second isolation dielectrics.

10. A method for preparing a trench type silicon carbide MOSFET structure, comprising:
   forming a first PN junction by doping the control gate structure; and
   forming a second PN junction by doping the control gate structure, wherein the second PN junction is juxtaposed and oppositely disposed to the first PN junction.

* * * * *